United States Patent [19]

Ohta

[11] Patent Number: 5,225,791
[45] Date of Patent: Jul. 6, 1993

[54] NON-SATURATING COMPLEMENTARY TYPE UNITY GAIN AMPLIFIER

[75] Inventor: Genichiro Ohta, Ebina, Japan

[73] Assignee: Matsushita Electric Industrial Co., Ltd., Osaka, Japan

[21] Appl. No.: 791,382

[22] Filed: Nov. 14, 1991

[30] Foreign Application Priority Data

Nov. 27, 1990 [JP] Japan ............................ 2-328610

[51] Int. Cl.⁵ ............................................ H03F 3/45
[52] U.S. Cl. .................................... 330/255; 330/260
[58] Field of Search ............... 330/252, 260, 255, 293, 330/311

[56] References Cited

U.S. PATENT DOCUMENTS 4,146,845  3/1979  Lunquist ....................... 330/260 X

*Primary Examiner*—Steven Mottola
*Attorney, Agent, or Firm*—Stevens, Davis, Miller & Mosher

[57] ABSTRACT

An amplifier circuit which can operate at a high speed for both ascending and descending signals. An input signal are individually amplified by a first differential amplifier of an NPN transistor and a second differential amplifier of a PNP transistor. The anti-phase collector outputs from the differential amplifiers are inverted-amplified by the common emitter type amplifiers of the transistors having a polarity opposite to those of the differential amplifiers, as the in-phase component and anti-phase component are dealt with individually. Thus, the amplifier circuit can operate at a high speed for both ascending and descending signals.

2 Claims, 2 Drawing Sheets

F I G. 2
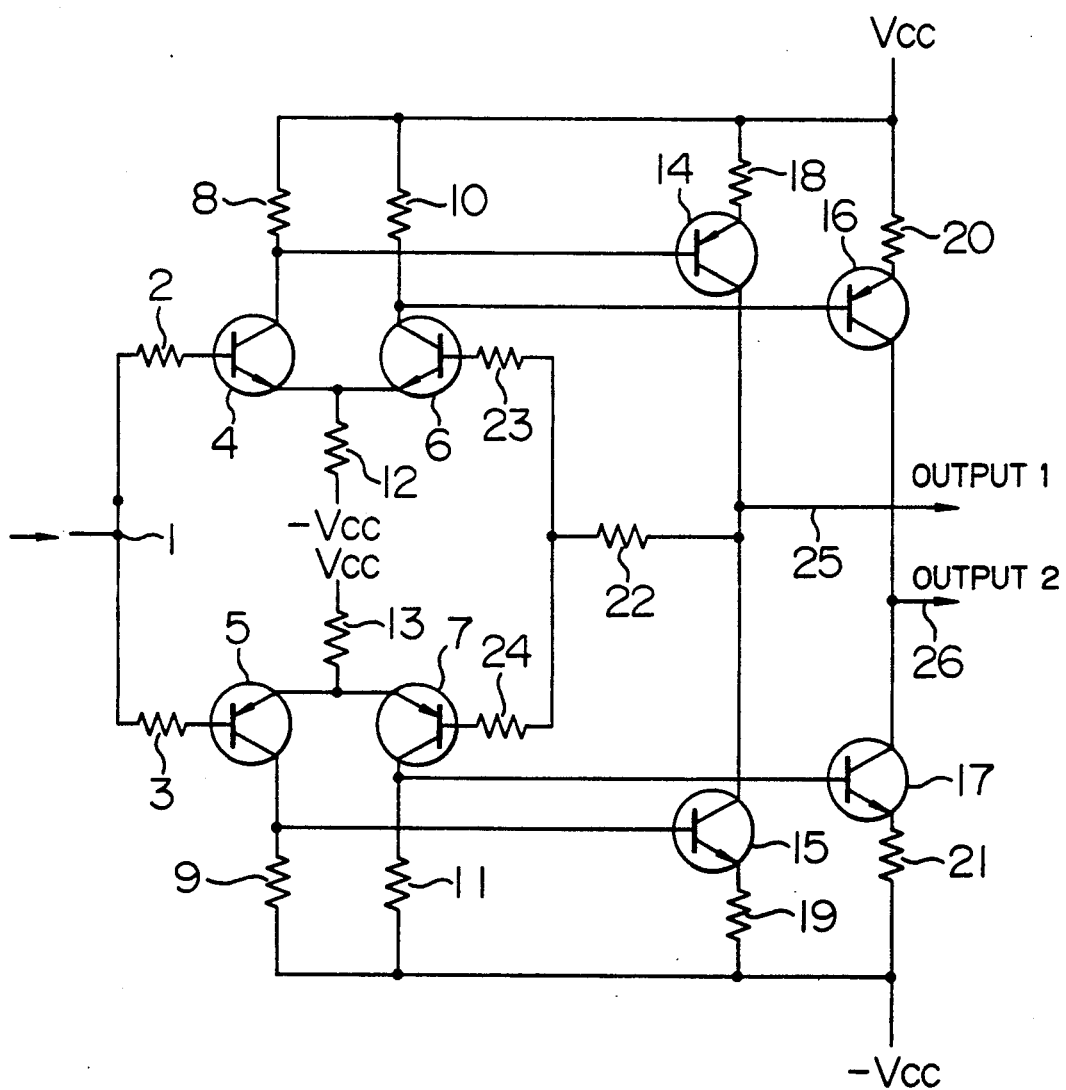

NON-SATURATING COMPLEMENTARY TYPE UNITY GAIN AMPLIFIER

BACKGROUND OF THE INVENTION

The present invention relates to an amplifier circuit for amplifying an electrical signal.

Conventionally, as a circuit configuration for operating at a high speed, such circuit having a high input capacitance (such as an analog/digital converter), a circuit has been proposed which includes a buffer amplifier unit in a cascade connected emitter follower arrangement.

FIG. 1 is the circuit diagram of an example of the conventional amplifier circuit (buffer amplifier).

In FIG. 1, an input terminal P1 is connected with a resistor 30 connected with the respective bases of an NPN transistor 31 and a PNP transistor 32. The emitter of the transistor 31 is connected with a negative power supply (−V) through a resistor 33, and the collector thereof is connected with a positive power supply (+V). The emitter of the transistor 32 is connected with the positive power supply (+V) through a resistor 35, and the collector thereof is connected with the negative power supply (−V) through a resistor 36. Further, the emitter of the transistor 31 is connected with the base of a PNP transistor 38 through a resistor 37, and the emitter of the transistor 32 is connected with the base of an NPN transistor 40 through a resistor 39. The collector of the transistor 38 is connected with the negative power supply (-V) through a resistor 41 and the emitter thereof is connected with the positive power supply (+V) through a resister 42 and also connected with an output terminal P2 through a resistor 43. The collector of the transistor 40 is connected with the positive power supply (+V) through a resistor 44, and the emitter thereof is connected with the negative power supply (-V) through a resistor 45 and also connected with the output terminal P2 through a resistor 46.

In operation, when an input signal is applied to the input terminal P1, its in-phase signal component is outputted to the emitter of the transistor 31 whereas its anti-phase signal component is outputted to the emitter of the transistor 32. The output from the transistor 31 which is sent to the transistor 38 the output signal from which is outputted at the output terminal P2. Likewise, the output signal from the transistor 32 which is sent to the transistor 40 the output from which is outputted at the output terminal P2. The output signals from the transistors 38 and 40 are synthesized to provide the signal similar to the input signal at the output terminal P2. This circuit, which is connected in cascade with the emitter follower, can provide a high input impedance.

It should be noted that in order to remove D.C. current offset, the above conventional circuit configuration is provided with NPN type emitter followers (NPN transistors 31, 40) and a PNP type emitter followers (PNP transistors 32, 38) in cascade connection with each other. The NPN type emitter follower operates at a relatively high speed for the ascending signal which places the state between its base and emitter in a forward-biased state with a relatively high voltage whereas it operates a relative low speed for the descending signal which causes the state between its base and emitter to reach its reverse-biased state. On the other hand, the PNP type emitter follower operates at a relatively high speed for the descending signal whereas it operates at a relatively low speed for the ascending signal.

In this way, the circuit composed of the NPN emitter follower and the PNP emitter follower in cascade connection cannot operate at a high speed for both ascending and descending signals.

SUMMARY OF THE INVENTION

An object of the present invention is to solve the above problem attendant on the prior art thereby to provide an amplifier circuit which can operate at a high speed for both ascending and descending signals.

In order to attain the above object, in accordance with the present invention, there is provided an amplifier circuit comprising a first differential amplifier composed of a pair of NPN transistors, a second differential amplifier composed of a pair of PNP transistors with an input terminal common to the first differential amplifier, a first common emitter type amplifier of a PNP transistor for amplifying the anti-phase collector output from the first differential amplifier, a second common emitter type amplifier of an NPN transistor for amplifying the anti-phase collector output from the second differential amplifier, and means for outputting the respective collector outputs of the above two common emitter type amplifiers to a common output terminal so that the output signals at the common output terminal are negative-fed-back to the other input terminals of the first and second differential amplifiers.

In accordance with the present invention, the in-phase component and the anti-phase component of an input signal are individually amplified by the first differential amplifier of the NPN transistors and the second differential amplifier of the PNP transistors, and the anti-phase collector outputs from the differential amplifiers are inverted-amplified by the common emitter type amplifiers of transistors having a polarity opposite to the transistors of the differential amplifiers. In this way, the path from the input stage to the output stage is designed in a common emitter structure which is a combination of an NPN type and a PNP type for removing D.C. voltage offset. Thus, the amplifier circuit according to the present invention can operate at a high speed for both ascending and descending signal.

The above and other objects and advantages will be apparent from the following description taken in conjunction with the accompanying drawings.

BRIEF DESCRIPTION OF THE DRAWINGS

FIG. 2 is a circuit diagram of the amplifier circuit according to the present invention.

DESCRIPTION OF THE PREFERRED EMBODIMENT

Figure 1:
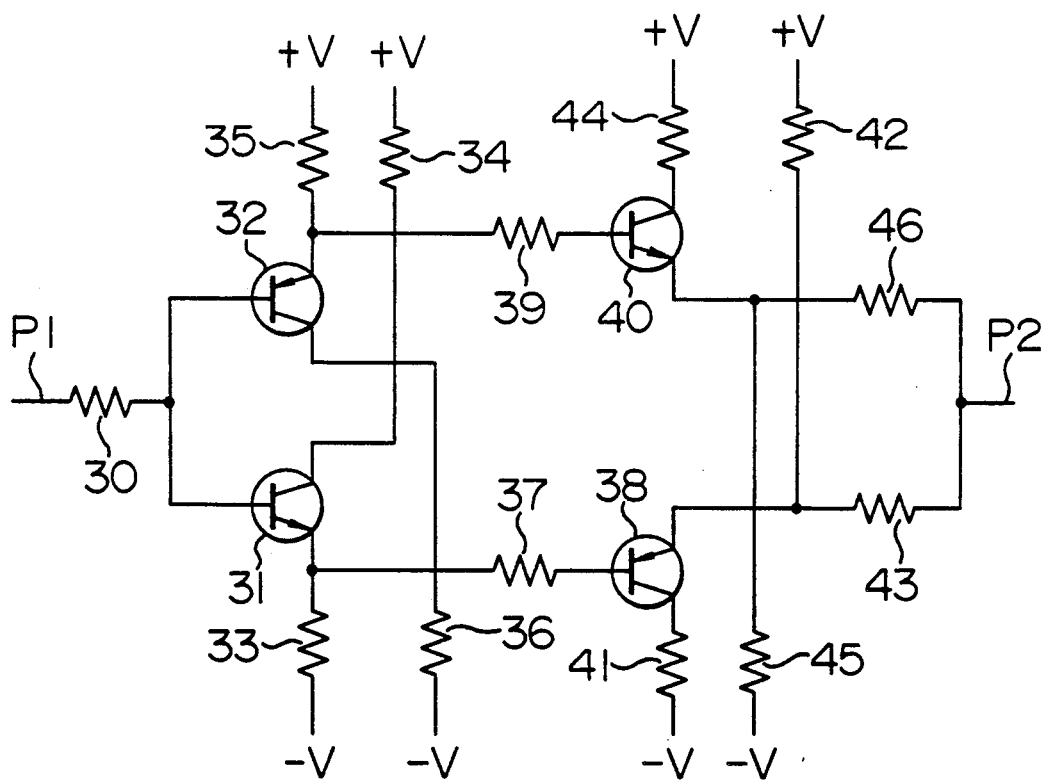
FIG. 1 is a circuit diagram of one example of the conventional amplifiers (buffer amplifiers)

Now referring to the drawings, an explanation will be given of one embodiment of the present invention.

FIG. 2 is a circuit diagram of the amplifier circuit according to one embodiment of the present invention.

As shown in FIG. 2, the input terminal 1 to which an input signal a is applied is connected with the base of a transistor (NPN) 4 through a resistor 2, and also connected with the base of a transistor (PNP) 5 through a resistor 3. The emitter of the transistor 4 as well as the emitter of a transistor (NPN) 6 are commonly connected with a negative power supply (−Vcc) through a resistor 12. The emitter of the transistor 5 as well as the emitter of a transistor (PNP) 7 are commonly connected with a positive power supply (Vcc) through a resistor 13. The transistors 4 and 6 constitute a first differential amplifier and the transistors 5 and 7 constitute a second differential amplifier. The collector of the transistor 4 is connected with the positive power supply (Vcc) through a resistor 8, and the collector of the transistor 5 is connected with the negative power supply (−Vcc) through a resistor 9. The collector of the transistor 6 is connected with the positive power supply Vcc through a reistor 10, and the collector of the transistor 7 is connected with the negative power supply −Vcc through a resistor 11. The bases of the transistors 6 and 7 are commonly connected with each other through resistors 23 and 24, respectively, and further are connected with the first ouput terminal 25 through a resistor 22. The collector of the transistor 4 is connected with the base of a transistor (PNP) 14 constituting a first common emitter amplifier whereas the collector of the transistor 5 is connected with the base of a transistor (NPN) 15 constituting a second common emitter amplifier. The collectors of the transistors 14 and 15 are commonly connected with the first output terminal 25. The emitter of the transistor 14 is connected with the positive power supply Vcc through a resistor 18 whereas the emitter of the transistor 15 is connected with the negative power supply (−Vcc). The base of a transistor (PNP) 16 is connected with the collector of the transistor 6, the emitter thereof is connected with the positive power supply Vcc through a resistor 20, and the collector thereof is connected with the second output terminal 26. Likewise, the base of a transistor (NPN) 17 is connected with the collector of the transistor 7, the emitter thereof is connected with the negative power supply −Vcc through a resistor 21 and the collector thereof is connected with the second output terminal 26.

In operation of the above arrangement, when an input signal a is applied to the input terminal 1, an amplified signal in anti-phase of the input signal a is produced at the collector of the transistor 4, and another amplified signal in phase with the input signal a is produced at the collector of the transistor 5. The output signal from the transistor 4 is amplified by the transistor 14 serving as a common emitter type circuit; the signal appearing at its collector is output as an output signal (inverting-amplified signal of the input signal) at the first output terminal. Thus, the signal in phase with the input signal a is output at the first output terminal 25.

On the other hand, the output signal from the transistor 5 is amplified by the transistor 15 serving as a common emitter type circuit; thus, the amplified signal (output amplified for a descending signal) in anti-phase with the input signal a is outputted at the first output terminal 25. In this way, the transistors 14 and 15 perform the amplifying operations out of phase by 180° from each other so that the outputs from the upper and lower transistors are synthesized to provide a doubled signal amplitude.

The signal at the first output terminal 25 is applied to the respective bases of the transistors 6 and 7 through the resistors 22, 23 and 24. Since the transistor 6 constitutes a differential amplifier 6 in a pair with the transistor 4, the signal applied to the base of the transistor 6 is a negative feedback signal for the input signal a from the base of the transistor 4. The magnitude of this negative feedback signal can be made much larger than the input signal with the aid of the first differential amplifier circuit composed of the transistors 4 and 6 and the common emitter type circuit of the transistor 14. Therefore, the negative feedback operation permits the output signal appearing at the collector terminal of the transistor 14 to have the same magnitude as the input signal a within a permitted range of error in the degree of the negative feedback.

Accordingly, the basic condition of a buffer amplifier, i.e. that the magnitudes of an input and output are made equal to each other can be satisfied. Further, the transistor 4, which is an NPN transistor as well as the transistor 6, can produce an output signal at a relatively high speed for the ascending signal which applies a higher forward bias voltage between its base and emitter. Therefore, the collector output from the transistor 4 which is the inverted output is excellent in the descending characteristic at a high speed. The transistor 14 receiving this collector output, which is a PNP transistor, produces an output at a high speed for the descending signal which applies a higher forward bias voltage between its base and emitter. Accordingly, the collector output of the transistor 4 with an excellent high-speed descending characteristic leads to the high-speed ascending characteristic of the collector output of the transistor 14.

In this way, the cascade connection of the NPN transistor designed in a common emitter amplifier circuit and the PNP transistor designed in a common emitter amplifier circuit can produce an output at a high speed for an ascending input signal.

Additionally, the output signal from the transistor 6, which is in anti-phase with the output from the transistor 4, is inverted-amplified by the transistor 16 to be output at the second output terminal 26. On the other hand, the output signal from the transistor 7, which is in anti-phase with the output from the transistor 5, is inverted-amplified by the transistor 17 to be likewise output at the second output terminal 26. Therefore, the signal output at the second output terminal 26 is in anti-phase with that at the first output terminal 25. Incidentally, the transistors 16 and 17 may be removed from the circuit configuration as long as only a buffer amplifier is required.

I claim:
1. An amplifier circuit comprising:
a first differential amplifier comprising a pair of NPN transistors, said first differential amplifier having a first input terminal and a second input terminal comprising resistors connected to base terminals of said NPN transistors to prevent saturation;
a second differential amplifier comprising a pair of PNP transistors, said second differential amplifier having a first input terminal and a second input terminal comprising resistors connected to base terminals of said PNP transistors to prevent saturation and having its first input terminal connected to that of said first differential amplifier to form a common input terminal;
a first common emitter type amplifier comprising a PNP transistor for receiving and amplifying an anti-phase collector output from said first differential amplifier, said first common emitter type amplifier having a resistor connected between an emitter thereof and a power supply circuit for preventing saturation;
a second common emitter type amplifier comprising an NPN transistor for receiving and amplifying an anti-phase collector output from the second differential amplifier, said second common emitter type amplifier having a resistor connected between an emitter thereof and a power supply circuit for preventing saturation; and resistor means for receiving and outputting the respective collector outputs of said first and second common emitter type amplifiers to a common output terminal, output signals at the common output terminal being negative-fed-back to the second input terminal of each of said first and second differential amplifiers.

2. An amplifier according to claim 1, further comprising:

a third common emitter type amplifier comprising a PNP transistor for amplifying an in-phase collector output from said first differential amplifier, said third common emitter type amplifier having a resistor connected between an emitter thereof and a power supply circuit for preventing saturation; and a fourth common emitter type amplifier comprising an NPN transistor for amplifying an in-phase collector output from said second differential amplifier, said fourth common emitter type amplifier having a resistor connected between an emitter thereof and a power supply circuit for preventing saturation;

wherein respective collector outputs of said third and fourth common emitter type amplifiers are connected to a second common output terminal so that a second output signal is output from the second common output terminal.

* * * * *